(12) United States Patent
Li

(10) Patent No.: US 10,008,766 B2
(45) Date of Patent: Jun. 26, 2018

(54) TOUCH SCREEN AND TERMINAL

(71) Applicant: ZTE Corporation, Shenzhen (CN)

(72) Inventor: Qun Li, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days. days.

(21) Appl. No.: 15/518,017

(22) PCT Filed: Jun. 3, 2015

(86) PCT No.: PCT/CN2015/080689
§ 371 (c)(1),
(2) Date: Apr. 10, 2017

(87) PCT Pub. No.: WO2016/054926
PCT Pub. Date: Apr. 14, 2016

(65) Prior Publication Data
US 2017/0317404 A1 Nov. 2, 2017

(30) Foreign Application Priority Data
Oct. 9, 2014 (CN) .......................... 2014 1 0528589

(51) Int. Cl.
H01Q 1/24 (2006.01)
H05K 1/02 (2006.01)
G06F 3/041 (2006.01)

(52) U.S. Cl.
CPC ........... H01Q 1/243 (2013.01); G06F 3/0412 (2013.01); H05K 1/028 (2013.01)

(58) Field of Classification Search
None
See application file for complete search history.

(56) References Cited

U.S. PATENT DOCUMENTS

| 2002/0152606 | A1 | 10/2002 | Huang | |
|---|---|---|---|---|
| 2012/0034888 | A1* | 2/2012 | De Flaviis | ............ G06F 1/1698 455/129 |
| 2012/0162032 | A1* | 6/2012 | Yang | .................... H01Q 1/2266 343/720 |
| 2012/0329524 | A1* | 12/2012 | Kent | ....................... G06F 3/044 455/566 |
| 2013/0059532 | A1 | 3/2013 | Mahanfar et al. | |

(Continued)

FOREIGN PATENT DOCUMENTS

| CN | 102308268 A | 1/2012 |
|---|---|---|
| CN | 102426492 A | 4/2012 |

(Continued)

OTHER PUBLICATIONS

International Search Report for corresponding application PCT/CN2015/080689 filed on Jun. 3, 2015; dated Aug. 28, 2015.

(Continued)

Primary Examiner — David Bilodeau
(74) Attorney, Agent, or Firm — Cantor Colburn LLP

(57) ABSTRACT

Provided is a touch screen and a terminal. The touch screen includes a touch layer, a conducting layer and a substrate layer which are laminated and matched in sequence, wherein an antenna radiating body, and an antenna signal line and a ground feeder line which are connected with the antenna radiating body are arranged on the conducting layer. The terminal includes the touch screen.

19 Claims, 3 Drawing Sheets

(56) References Cited

U.S. PATENT DOCUMENTS

2014/0043261 A1    2/2014  Wang
2014/0113579 A1*  4/2014  Li ........................... G06F 3/041
                                                                     455/269
2014/0347232 A1*  11/2014  Mahanfar .............. H01Q 1/521
                                                                     343/720

FOREIGN PATENT DOCUMENTS

EP          2728449  A2    5/2014
EP        26634675  A1    5/2014
JP           273532  A    10/1995

OTHER PUBLICATIONS

Supplementary European Search Report Application No. EP15849222; dated May 24, 2017; pp. 11.

\* cited by examiner

TOUCH SCREEN AND TERMINAL

TECHNICAL FIELD

The disclosure relates to the technical field of communications, and more particularly to a touch screen and a terminal.

BACKGROUND

A conventional antenna is attached to a shell as a Flexible Printed Circuit (FPC) or sheet steel, and then is connected with a main board through a leaf spring or a PIN to form a circuit, which is required to reserve an enough area for the antenna in a structure of the shell. However, mobile terminals are developed to be light, thin and large, and spaces for antennae are compressed to be smaller and smaller, so it is more and more difficult to design antennae. Particularly, when a metal component is arranged on a shell of a terminal, for achieving high radiation performance of an antenna, designing of the antenna needs to avoid the metal component, or utilize the metal component to make the metal component form a part of the antenna. Such a design method limits an appearance design of the terminal, or forms a similar uncreative design. Aesthetic appearance and practicability may not be achieved at the same time.

SUMMARY

The disclosure provides a touch screen and terminal, which are adopted to solve the problem that the conventional arrangement manner for an antenna restricts the appearance and material designing for a terminal in the related art.

A touch screen includes: a touch layer, a conducting layer and a substrate layer which are laminated and matched in sequence, wherein an antenna radiating body, and an antenna signal line and a ground feeder line which are connected with the antenna radiating body are arranged on the conducting layer.

Alternatively, in the touch screen of embodiments of the disclosure, the antenna radiating body, the antenna signal line and the ground feeder line are arranged in a non-display area on the conducting layer, or are arranged in a non-touch area in a display area on the conducting layer.

Alternatively, in the touch screen of the embodiments of the disclosure, the antenna signal line and the ground feeder line are led out through an FPC to be connected with a radio frequency chip.

Alternatively, in the touch screen of the embodiments of the disclosure, a baseband control line configured to respond to a touch signal is further arranged on the conducting layer, and the baseband control line is led out through the FPC to be connected with a baseband processing chip.

Alternatively, in the touch screen of the embodiments of the disclosure, the antenna radiating body arranged on the conducting layer is formed by adopting a spraying and coating manner, an electroplating manner or an implementable process for forming a conducting film of the touch screen.

A terminal includes the abovementioned touch screen.

Alternatively, in the terminal of the embodiments of the disclosure, the antenna signal line and the ground feeder line which are arranged on the conducting layer of the touch screen are led out of the touch screen through an FPC to be connected to a radio frequency chip on a main board of the terminal.

Alternatively, in the terminal of the embodiments of the disclosure, a baseband control line arranged on the conducting layer of the touch screen is led out through the FPC to be connected to a baseband processing chip on the main board of the terminal.

According to the embodiments of the disclosure, the antenna radiating body is arranged on the touch screen to implement the arrangement for an antenna. Such an arrangement manner can achieve better antenna radiating performance, and can also have no limitation on the appearance design of the terminal; such an arrangement manner reduces the thickness of the terminal, influences that the metal component affects the antenna and assembling procedures of the antenna; and improves consistency for assembling the antenna.

DETAILED DESCRIPTION OF THE EMBODIMENTS

In order to solve the problem that the conventional arrangement manner for an antenna restricts the appearance and material designing for a terminal in the related art, the embodiments of the disclosure provide a touch screen and a terminal. Wires are arranged on a conducting layer of the touch screen to realize a function of the antenna, so that the terminal with the touch screen can achieve better antenna radiating performance, and can also have no limitation on the appearance design of the terminal. Embodiments of the disclosure will be described below with reference to the drawings in the embodiments of the disclosure.

Embodiment 1

Figure 1:
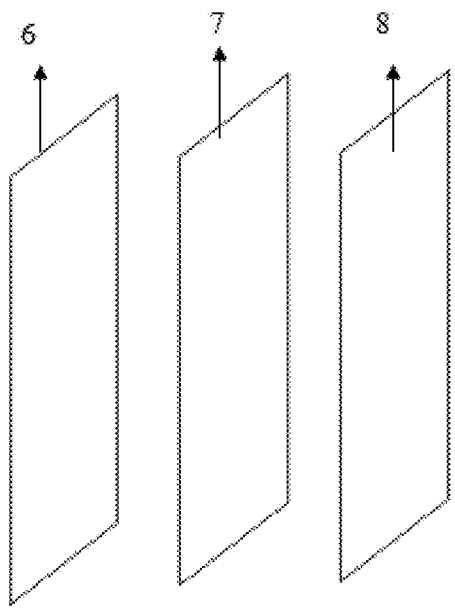
FIG. 1 is a schematic diagram showing composition of a touch screen according to an embodiment of the disclosure.

The embodiment of the disclosure provides a touch screen. As shown in FIG. 1, the touch screen includes a touch layer 6, a conducting layer 7 and substrate layer 8, which are laminated and matched in sequence.

Figure 2:
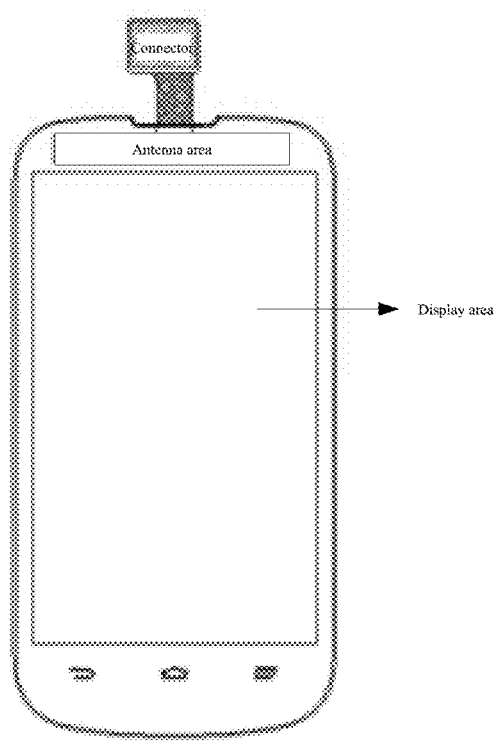
FIG. 2 is a schematic diagram showing an arrangement of an antenna in a touch screen according to an embodiment of the disclosure.
Figure 3:
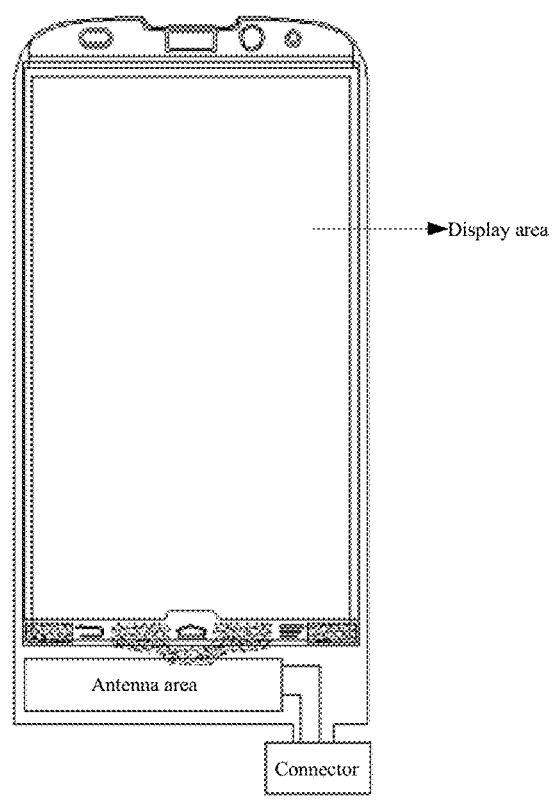
FIG. 3 is another schematic diagram showing an arrangement of an antenna in a touch screen according to an embodiment of the disclosure.

In the embodiment, an antenna radiating body, and an antenna signal line and a ground feeder line which are connected with the antenna radiating body are arranged on the conducting layer 7, wherein when the antenna radiating body, and the antenna signal line and the ground feeder line which are connected with the antenna radiating body are arranged, a basic arrangement principle is that a baseband control line (wiring configured to realize a touch function) of the touch screen is avoided. Therefore, in the embodiment of the disclosure, the antenna radiating body, the antenna signal line and the ground feeder line are arranged in a non-display area on the conducting layer. A touch screen on a mobile phone terminal is taken as an example, so the antenna radiating body, the antenna signal line and the ground feeder line may be arranged in a non-display area which is positioned above a display area of the mobile phone terminal, as shown in FIG. 2, or the antenna radiating body, the antenna signal line and the ground feeder line may be arranged in a non-display area which is positioned below the display area of the mobile phone terminal, as shown in FIG. 3.

Figure 4:
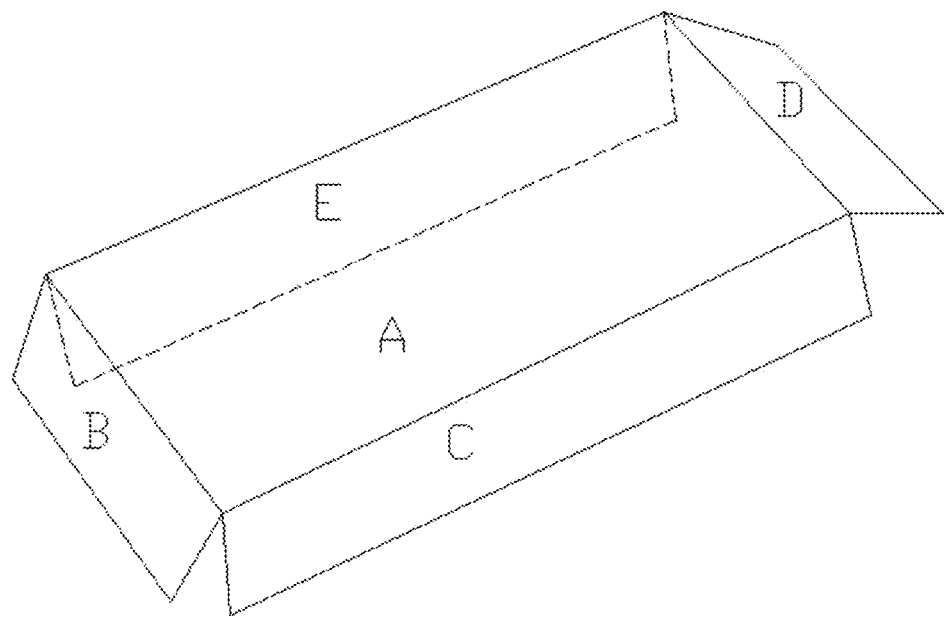
FIG. 4 is a simple bending diagram showing a touch screen according to an embodiment of the disclosure.

In addition, along with development of touch screen technology, the touch screen may be bent. FIG. 4 is a simple bending diagram showing a touch screen. In the figure, the touch screen may be bent in leftward, rightward, upward and downward directions, and in the figure, areas B, C, D and E are bent areas. At present, bending the touch screen is based on different purposes, wherein there are some conditions where the bent areas are only configured for display and not respond to a touch operation. At this moment, the antenna radiating body and antenna wiring may be arranged in a non-touch area in a display area of the conducting layer.

Alternatively, in the embodiment, the antenna signal line and the ground feeder line are led out through an FPC so as to be connected with a radio frequency chip, so an antenna radiating and receiving circuit is formed.

Alternatively, in the embodiment, a forming manner for the antenna radiating body arranged on the conducting layer includes, but not limited to: a spraying and coating manner, an electroplating manner or an implementable process for forming a conducting film of the touch screen.

According to the embodiment of the disclosure, wiring is performed on the conducting layer of the touch screen to realize the function of the antenna, and supports are provided for the terminal to achieve better antenna radiating performance of the terminal and have no limitation on the appearance design of the terminal.

Embodiment 2

The embodiment of the disclosure provides a terminal. The terminal includes the touch screen of embodiment 1, that is, the terminal of the embodiment improves a conventional antenna arrangement manner, and an antenna is arranged through the touch screen.

A connecting manner between the touch screen and an internal chip of the terminal will be described below.

Figure 5:
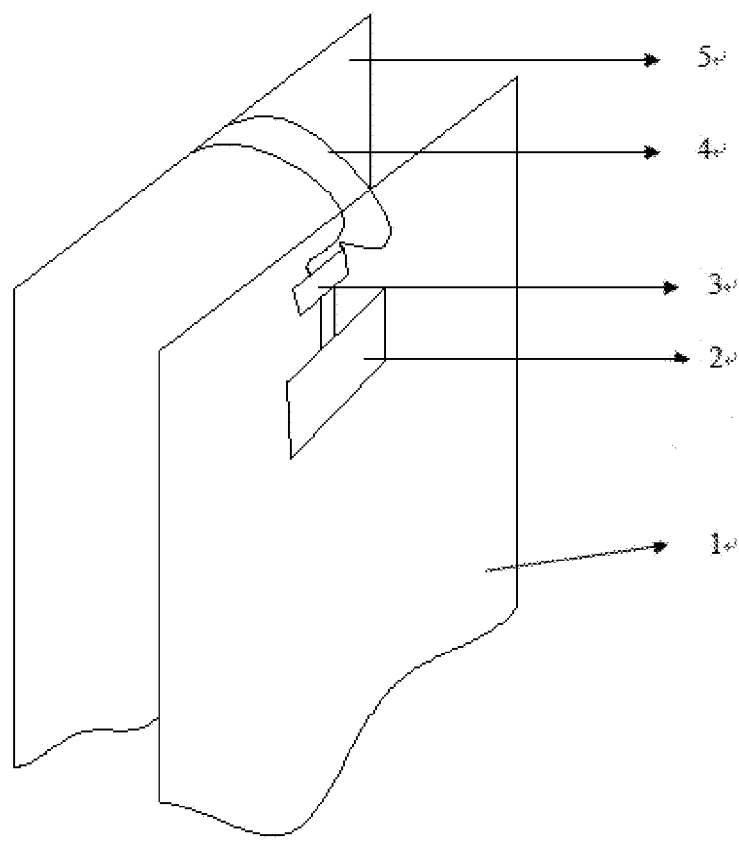
FIG. 5 is a schematic diagram showing a connection between a touch screen and a main board of a terminal according to an embodiment of the disclosure.

As shown in FIG. 5, 1 is a main board of the terminal; 2 is a radio frequency chip arranged on the main board; 3 is a connector arranged on the main board; 4 is an FPC of the touch screen; and 5 is the touch screen with the antenna.

An antenna signal line and a ground feeder line which are arranged on a conducting layer in the touch screen 5 are connected with the radio frequency chip 2 on the main board 1 through the FPC 4 and the connector 3 so as to form a circuit.

The FPC 4 may include a touch signal of the touch screen 5, and when the touch signal is included, after the connector 3 is connected with the main board 1, the signal line of the touch signal is connected with a baseband processing chip. The antenna signal line is connected with the radio frequency chip 2.

In conclusion, according to the embodiments of the disclosure, the antenna radiating body is arranged on the touch screen of the terminal, so that an available space for the antenna is greatly utilized, and the thickness of the terminal and influences that the metal component affects the antenna are reduced. In addition, assembling procedures of the antenna are reduced, and the consistency for assembling the antenna is improved.

INDUSTRIAL APPLICABILITY

According to the embodiments of the disclosure, the antenna radiating body is arranged on the touch screen to implement the arrangement for an antenna. Such an arrangement manner can achieve better antenna radiating performance, and can also have no limitation on the appearance design of the terminal; such an arrangement manner reduces the thickness of the terminal, influences that the metal component affects the antenna and assembling procedures of the antenna; and improves consistency for assembling the antenna.

What is claimed is:

1. A touch screen, comprising a touch layer, a conducting layer and a substrate layer which are laminated and matched in sequence, wherein an antenna radiating body, and an antenna signal line and a ground feeder line which are connected with the antenna radiating body are arranged on the conducting layer; wherein the antenna signal line and the ground feeder line are led out through a Flexible Printed Circuit (FPC) to be connected with a radio frequency chip.

2. The touch screen as claimed in claim 1, wherein the antenna radiating body, the antenna signal line and the ground feeder line are arranged in a non-display area on the conducting layer, or are arranged in a non-touch area in a display area on the conducting layer.

3. The touch screen as claimed in claim 1, wherein a baseband control line configured to respond to a touch signal is further arranged on the conducting layer, and the baseband control line is led out through the FPC to be connected with a baseband processing chip.

4. The touch screen as claimed in claim 1, wherein the antenna radiating body arranged on the conducting layer is formed by adopting a spraying and coating manner, an electroplating manner or an implementable process for forming a conducting film of the touch screen.

5. A terminal, comprising a touch screen as claimed in claim 1.

6. The terminal as claimed in claim 5, wherein in the touch screen, the antenna signal line and the ground feeder line which are arranged on the conducting layer of the touch screen are led out of the touch screen through a Flexible Printed Circuit (FPC) to be connected to a radio frequency chip on a main board of the terminal.

7. The terminal as claimed in claim 6, wherein in the touch screen, a baseband control line arranged on the conducting layer of the touch screen is led out through the FPC to be connected to a baseband processing chip on the main board of the terminal.

8. The touch screen as claimed in claim 2, wherein the antenna signal line and the ground feeder line are led out through a Flexible Printed Circuit (FPC) to be connected with a radio frequency chip.

9. The touch screen as claimed in claim 8, wherein a baseband control line configured to respond to a touch signal is further arranged on the conducting layer, and the baseband control line is led out through the FPC to be connected with a baseband processing chip.

10. A terminal, comprising a touch screen as claimed in claim 2.

11. The terminal as claimed in claim 10, wherein in the touch screen, the antenna signal line and the ground feeder line which are arranged on the conducting layer of the touch screen are led out of the touch screen through a Flexible Printed Circuit (FPC) to be connected to a radio frequency chip on a main board of the terminal.

12. The terminal as claimed in claim 11, wherein in the touch screen, a baseband control line arranged on the conducting layer of the touch screen is led out through the FPC to be connected to a baseband processing chip on the main board of the terminal.

13. A terminal, comprising a touch screen as claimed in claim 1.

14. The terminal as claimed in claim 13, wherein in the touch screen, the antenna signal line and the ground feeder line which are arranged on the conducting layer of the touch screen are led out of the touch screen through a Flexible Printed Circuit (FPC) to be connected to a radio frequency chip on a main board of the terminal.

15. The terminal as claimed in claim 14, wherein in the touch screen, a baseband control line arranged on the conducting layer of the touch screen is led out through the FPC to be connected to a baseband processing chip on the main board of the terminal.

16. A terminal, comprising a touch screen as claimed in claim 3.

17. A terminal, comprising a touch screen as claimed in claim 4.

18. A terminal, comprising a touch screen as claimed in claim 8.

19. A terminal, comprising a touch screen as claimed in claim 9.

* * * * *